(12) United States Patent
Giousouf et al.

(10) Patent No.: US 6,831,531 B1
(45) Date of Patent: Dec. 14, 2004

(54) TIME BASE COMPRISING AN INTEGRATED MICROMECHANICAL TUNING FORK RESONATOR

(75) Inventors: Metin Giousouf, Esslingen (DE);
Heinz Kück, Stuttgart (DE); Rainer Platz, Neuchâtel (CH)

(73) Assignee: Eta Sa Manufacture Horlogere Suisse, Grenchen (CH)

( * ) Notice: Subject to any disclaimer, the term of this patent is extended or adjusted under 35 U.S.C. 154(b) by 27 days.

(21) Appl. No.: 10/451,070

(22) PCT Filed: Nov. 13, 2001

(86) PCT No.: PCT/CH01/00665

§ 371 (c)(1),
(2), (4) Date: Jun. 20, 2003

(87) PCT Pub. No.: WO02/51004

PCT Pub. Date: Jun. 27, 2002

(30) Foreign Application Priority Data

Dec. 21, 2000 (EP) .............................. 00204720

(51) Int. Cl.[7] .................................. H03H 9/02
(52) U.S. Cl. ...................... 333/200; 333/185
(58) Field of Search ................. 333/200, 184, 333/185, 186, 187, 197, 192, 174, 262

(56) References Cited

U.S. PATENT DOCUMENTS

| 4,381,672 A | 5/1983 | O'Connor et al. |
| 4,764,244 A | 8/1988 | Chitty |
| 5,918,354 A | 7/1999 | Ikegami et al. |
| 6,734,762 B2 * | 5/2004 | Cornett et al. ............... 333/186 |
| 6,744,335 B2 * | 6/2004 | Ryhanen et al. ............ 333/185 |

OTHER PUBLICATIONS

Nguyen C. T.–C et al: Quality Factor Control for Micromechanical Resonators, International Electron Devices Meeting (IEDM), US, NY, IEEE, Dec. 13, 1992 pp. 505–508.

Dubravka Bilic: Micromachined Resonators and/or Oscillators Sandia New Release; www.sandia.gov/media/memquar.htm, Date Unknown.

* cited by examiner

*Primary Examiner*—Brian Young
*Assistant Examiner*—Joseph Lauture
(74) *Attorney, Agent, or Firm*—Sughrue Mion, PLLC (57) ABSTRACT

There is described a time base comprising a resonator (4) and an integrated electronic circuit (3) for driving the resonator into oscillation and for producing, in response to this oscillation, a signal having a determined frequency. The resonator is an integrated micromechanical tuning fork resonator (4) supported above a substrate (2) and adapted to oscillate in a plane substantially parallel to the substrate. The tuning fork resonator comprises a base member (5) extending substantially perpendicularly from the substrate, a freestanding oscillating structure (6) connected to the base member and including at least a first pair of substantially parallel fork tines (7, 8) and an electrode structure (9) disposed adjacent to the fork tines and connected to the integrated electronic circuit.

18 Claims, 10 Drawing Sheets

Fig.1

Fig.2 cross-section A-A'

Fig.2a cross-section B-B'

Fig.9 cross-section A-A'

TIME BASE COMPRISING AN INTEGRATED MICROMECHANICAL TUNING FORK RESONATOR

BACKGROUND OF THE INVENTION

The present invention relates to a time base, i.e. a device comprising a resonator and an integrated electronic circuit for driving the resonator into oscillation and for producing, in response to this oscillation, a signal having a determined frequency.

Time bases, or frequency standards, are required in a large variety of electronic devices, ranging from wristwatches and other timepieces to complex telecommunication devices. Such time bases are typically formed by an oscillator including a quartz resonator and an electronic circuit for driving the resonator into oscillation. An additional division chain may be used to divide the frequency of the signal produced by the oscillator in order to obtain a lower frequency. Other parts of the circuit may serve to adjust the frequency, for example by adjusting the division ratio of the division chain. The components of the electronic circuit are advantageously integrated onto a single semiconductor substrate in CMOS technology. Other functions, not directly related to the frequency processing, may be integrated onto the same substrate.

Advantages of quartz resonators are their high quality factor Q leading to good frequency stability and low power consumption as well as their good temperature stability. A disadvantage of typical time bases using quartz resonators however resides in the fact that two components, namely the quartz resonator and the integrated electronic circuit, are required in order to provide a high-precision frequency. A discrete quartz resonator requires board space which is scarce in many cases. For instance, a standard quartz resonator for wristwatch applications requires space of the order of 2×2×6 mm$^3$. Moreover, additional costs are caused by the assembly and connection of the two components. Yet, space and assembly costs are major issues, especially in the growing field of portable electronic devices.

It is thus a principal object of the present invention to provide a solution to the above-mentioned problems by providing a time base comprising an integrated resonator.

SUMMARY OF THE INVENTION

Another object of the present invention is to provide a time base that may be fully integrated on a single substrate, that is suitable for mass production and that is compatible with CMOS technology.

Still another object of the present invention is to provide a time base comprising a resonator having an improved quality factor Q and thereby a greater frequency stability and low power consumption.

Yet another object of the present invention is to provide such a time base which is low-priced and requires only a very small surface area on a semiconductor chip.

Accordingly, there is provided a time base comprising a resonator and an integrated electronic circuit for driving said resonator into oscillation and for producing, in response to said oscillation, a signal having a determined frequency, characterised in that said resonator is an integrated micromechanical tuning fork resonator supported above a substrate and adapted to oscillate, according to a first oscillation mode, in a plane substantially parallel to said substrate, said tuning fork resonator comprising a base member extending substantially perpendicularly from said substrate, a freestanding oscillating structure connected to said base member and including at least a first pair of substantially parallel fork tines disposed in said plane, and an electrode structure disposed adjacent to said fork tines and connected to said integrated electronic circuit.

An advantage of the time base according to the present invention lies in the fact that the micromechanical tuning fork resonator exhibits a high quality factor Q.

Quality factors as high as 50'000 have been measured which is of the same order as those obtained using conventional quartz resonators. The quality factor Q is determined by air friction and by intrinsic losses in the vibrating resonator material. Air friction can be neglected if the resonator is operated under vacuum conditions. Intrinsic losses depend on the material as well as on the design of the resonator. Resonators made of crystalline materials, like quartz or silicon, are known to be capable of high-Q oscillation. In addition, the clamping, i.e. the mechanical support of the resonator part, strongly influences the dynamic behaviour. According to the present invention, the tuning fork resonator is designed and driven in such a way that the centre of gravity of the entire structure remains motionless during oscillation and that the bending moments of the fork tines can be compensated in a relatively small region of the base member. Different design features favouring a high quality factor Q are the object of the dependent claims and will be described hereinafter in detail.

In addition, for a given resonant frequency, the surface area required on the substrate to form the tuning fork resonator is small in comparison with other resonators. For instance, a tuning fork resonator according to the present invention designed for a frequency of 32 kHz requires a chip area of approximately 0.2 mm$^2$ which is smaller than the chip area required by the silicon ring resonator described in pending international application No. PCT/CH 00100583 filed on Nov. 1, 2000 by the same Applicant.

According to one aspect of the invention, the electronic circuit is advantageously integrated on the substrate together with the micromechanical tuning fork resonator, thereby leading to a low-priced time base. A lower price is also obtained by vacuum-sealing of the resonator at the wafer-level in a batch-process using wafer-bonding technology.

Tuning fork structures have been proposed as resonating structures for different types of sensor applications, such as acceleration, rotation or strain sensors. These sensor structures are, however, not optimised according to the same guidelines as in the present invention where a high quality factor is a primary goal in order to obtain a highly precise time base.

U.S. Pat. No. 5,747,691 to Yoshino et al. for instance describes a tuning fork-shaped vibratory element made of a single crystalline silicon substrate. The tines of the tuning fork have thin and thick regions in order to allow a bending of the arm in a direction perpendicular to the oscillation when an external force is applied. The resonating element has been optimised with respect to the sensor application.

GB Patent No. 2,300,047 to Fitzpatrick et al. describes an assembly of tuning fork sensors in order to provide a three-dimensional motion detection.

Yet other documents, e.g. WO 91103716 to Jensen et al., GB 2,162,314 to Greenwood et al., U.S. Pat. No. 4,912,990 to Norling et al., or the article of Beeby et al. in the Journal of Microelectromechanical Systems, Vol. 9, No. 1 (2000), pp. 104 ff., describe micromachined silicon resonant strain gauges in the form of a double-ended tuning fork.

None of the above-cited documents however indicates or suggests using such a type of tuning fork resonator in an oscillator circuit to act as a frequency standard or time base. Moreover, a number of design features of the tuning fork resonators disclosed in these documents render them less suitable for horological applications where frequency stability and low power consumption are essential.

Anisotropically etched oscillating tuning fork structures have been described previously by the present inventors. Anisotropic etching of the structure inevitably yields, however, a different length of the fork tines, which results, in turn, in a low quality factor for such a tuning fork resonator. The fabrication method and disadvantages of such anisotropically etched tuning fork resonators are discussed in greater details in the article by M. Giousouf et al., published in Proc. of Eurosensors XII, Vol. 1 (1998), pp. 381–384, or the article by M. Giousouf et al., published in Sensors and Actuators 76 (1999), pp. 416–424, both entitled "Structuring of Convex Corners using a Reoxidation Process-Application to a Tuning Fork Resonator made from (110)-Silicon". Those skilled in the art will easily understand that this type of resonating structures is particularly unsuited to form a high-precision time base. Q factors of around 1000 have been measured in vacuum on such structures, which is by far too low for an application as a frequency standard.

Tuning fork resonators according to the present invention are optimised to yield oscillation with a high quality factor Q, low power consumption and to require a very small surface area on the chip. The resonator can be driven at voltages as low as 1 V which makes the use of batteries as power source in portable electronic devices possible. Furthermore, design features are presented which facilitate the mass production of such resonators due to an enhanced tolerance with respect to technological process variations.

According to another aspect of the present invention, a temperature measuring circuit may be integrated on the substrate in order to compensate for the effect of temperature on the frequency of the signal produced by the time base. Such compensation of the resonator's temperature dependency may easily be effected since the tuning fork resonator of the present invention has the advantage of exhibiting substantially linear temperature characteristics.

According to still another aspect of the present invention, a second micromechanical tuning fork resonator may be formed on the same substrate in order to allow temperature compensation. According to another aspect of the invention, temperature compensation is also achieved by using a single micromechanical tuning fork resonator which is operated simultaneously with two oscillation modes having different resonant frequencies.

BRIEF DESCRIPTION OF THE DRAWINGS

Other aspects, features and advantages of the present invention will be apparent upon reading the following detailed description of non-limiting examples and embodiments made with reference to the accompanying drawings.

Dimensions in the drawings are not to scale.

DETAILED DESCRIPTION OF THE DRAWINGS

Figure 1:
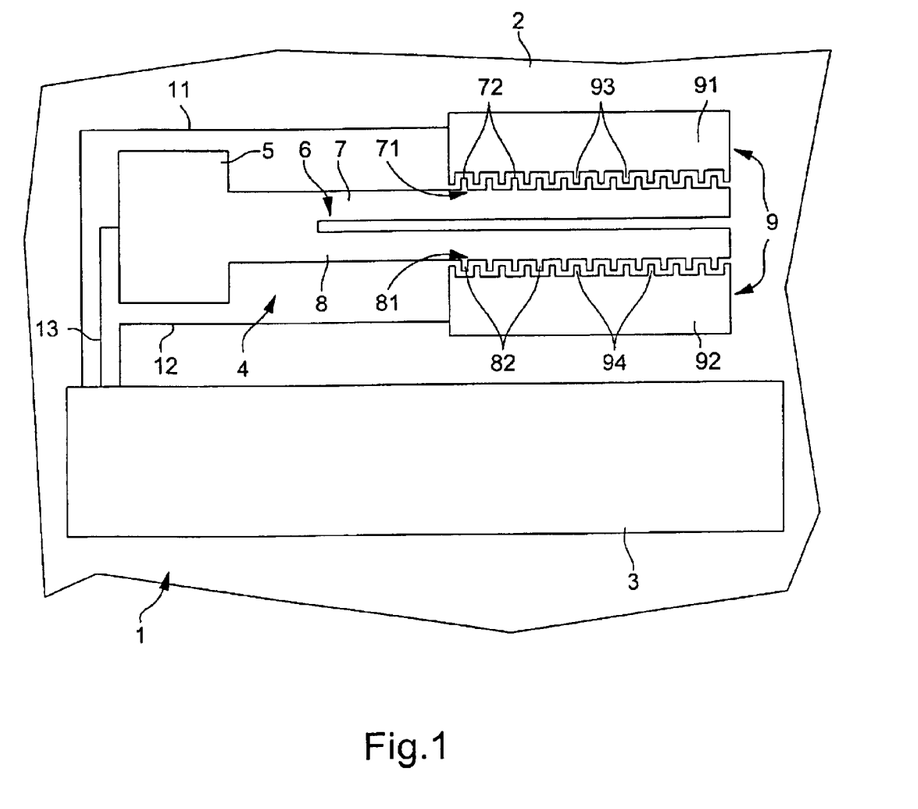
FIG. 1 is a top view illustrating schematically a time base according to the present invention comprising a micromechanical tuning fork resonator and an integrated electronic circuit.

FIG. 1 schematically shows a top view of a time base according to the present invention. There is shown an integrated time base, indicated generally by reference numeral 1, comprising a resonator 4 and an integrated electronic circuit 3 for driving the resonator into oscillation and for producing, in response to this oscillation, a signal having a determined frequency. The integrated electronic circuit 3 is not shown in detail since this circuit may easily be designed by those skilled in the art. Preferably both the integrated electronic circuit 3 and the resonator 4 are realised and integrated on a same substrate, indicated generally by reference numeral 2, as illustrated in FIG. 1. A preferred substrate material is silicon, but other similar materials known by those skilled in the art to be equally suitable for realising the time base of the present invention may be used.

According to the present invention, the resonator 4 is realised in the form of a monolithic micromechanical tuning fork resonator. The resonator 4 is supported above the substrate 2 and adapted to oscillate in a plane parallel to the substrate 2. The tuning fork resonator 4 essentially comprises a base member 5 extending perpendicularly from the substrate 2 and a free-standing oscillating structure, indicated globally by reference numeral 6, connected to the base member 5 and including a pair of substantially parallel fork tines 7, 8 disposed parallel to the substrate 2. It is worthwhile to note that the only mechanical connection between the tuning fork resonator 4 and the substrate 2 is the tuning fork base member 5 resulting in free-standing movable tines 7, 8.

The tuning fork resonator 4 further comprises an electrode structure 9 for driving the resonator 4 into oscillation and sensing this oscillation, as will be explained in more detail hereinafter.

Figure 5A:
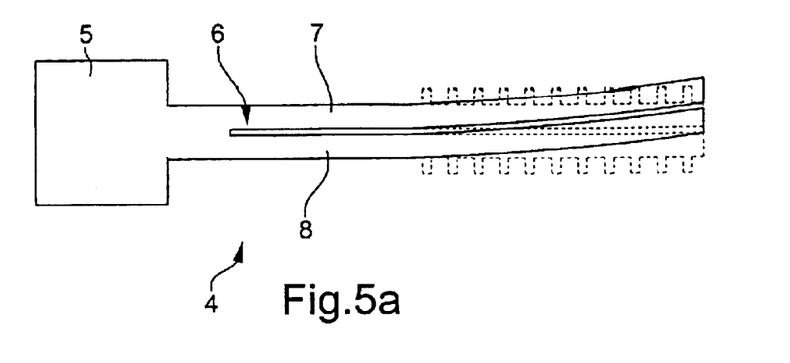
FIGS. 5a and 5b respectively show a first and a second in-plane oscillation mode where the fork tines oscillate in an asymmetric or "in-phase" manner and in a symmetric or "anti-phase" manner respectively.
Figure 5B:
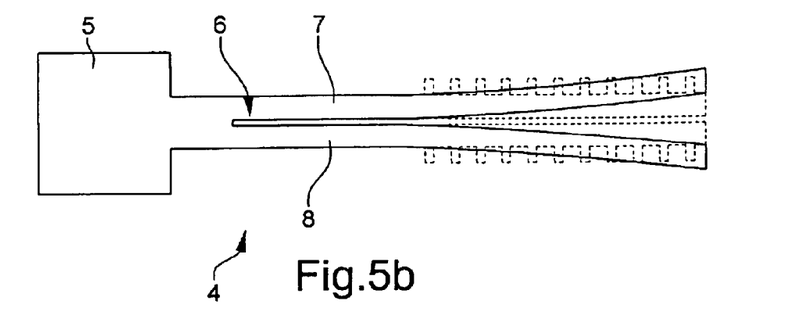

According to a preferred embodiment of the invention, comb-shaped structures 71, 81 are respectively provided on the fork tines 7, 8. These comb-shaped structures 71, 81 form part of the electrode structure 9 of the tuning fork resonator and each include first electrode members 72, 82 extending substantially perpendicularly from a side of each fork tine 7, 8. In the illustration of FIG. 1, these electrode members 72, 82 are provided on the outside of the fork tines 7, 8, i.e. away from the gap existing between the fork tines. Alternatively, the comb-shaped structures may be provided on the inside of the fork tines 7, 8. This option requires a wider gap between the fork tines in order to accommodate one or two electrodes therebetween (one next to each one of fork tines 7 and 8). However, a wider gap reduces the coupling between the tines and reduces the quality factor Q of a desired anti-phase oscillation (FIG. 5b).

The electrode structure 9 further comprises, in the example of FIG. 1, first and second comb-shaped electrode structures, indicated respectively by reference numerals 91 and 92, which are disposed on the substrate 2 next to the fork tines 7, 8 so as to mesh with the comb-shaped structures 71, 81. More particularly, the first comb-shaped electrode structure 91 includes second electrode members 93 and meshes with comb-shaped structure 71 so that the first electrode members 72 are adjacent to the second electrode members 93, and the second comb-shaped electrode structure 92 includes second electrode members 94 and meshes with comb-shaped structure 81 so that the first electrode members 82 are adjacent to the second electrode members 94.

It will be appreciated that the comb-shaped structures provided on both the fork tines 7, 8 and the electrode structures 91, 92 are not absolutely necessary. The use of meshing comb-shaped structures is however particularly advantageous since a high phase shift can be obtained at low power consumption. Furthermore, the dependency of the resonant frequency on the applied voltages is strongly reduced if such comb-shaped structures are used.

According to a first variant, the first comb-shaped electrode structure 91 serves to electrostatically drive the tuning fork resonator 4 into oscillation, and the second comb-shaped electrode structure 92, disposed on the opposite side of the tuning fork resonator 4, serves to capacitively sense the oscillation of the resonator. Accordingly, conductors 11, 12, 13 respectively serve to connect the first comb-shaped electrode structure 91, the second comb-shaped electrode structure 92 and the tuning fork 4, via its base member 5, to the integrated electronic circuit 3 which comprises an oscillator circuit (not shown) which drives the tuning fork into resonance. The resulting highly stable frequency signal can further be processed by the integrated circuit 3, for instance by dividing the frequency of the resulting signal in a frequency divider in order to obtain a lower frequency signal.

It should be pointed out that despite the fact that only one electrode structure, namely electrode structure 91, is used as driving electrode, both fork tines will be driven into oscillation as the oscillation induced in one fork tine will be transmitted to the other fork tine via the base member 5.

It will also be noted that the resonator essentially exhibits two fundamental in-plane oscillation modes. A first of this oscillation modes consists in an asymmetric oscillation of the two fork tines where both tines oscillate in the same direction. The second oscillation mode consists in a symmetric oscillation of the fork tines where both tines oscillate in opposite directions. These two in-plane oscillation modes are schematically illustrated in FIGS. 5a and 5b where the amplitude of oscillation has been exaggerated for the purpose of explanation. It will be appreciated that the second oscillation mode, which may be described as an "anti-phase" oscillation mode, is to be preferred to the first one since, according to this second oscillation mode, the centre of gravity of the resonating structure remains substantially motionless. In contrast to the second oscillation mode, the asymmetric oscillation will lead to higher energy dissipation and therefore a higher damping of the oscillation.

According to another variant, the first and second comb-shaped electrode structures 91 and 92 are connected together and are both used as driving electrodes. Thereby an anti-phase oscillation of the fork tines 7, 8 as illustrated in FIG. 5b is preferably excited. In this case, sensing of the resonator's oscillation is advantageously done by measuring the impedance and detecting the impedance shift at resonance.

Figure 2:
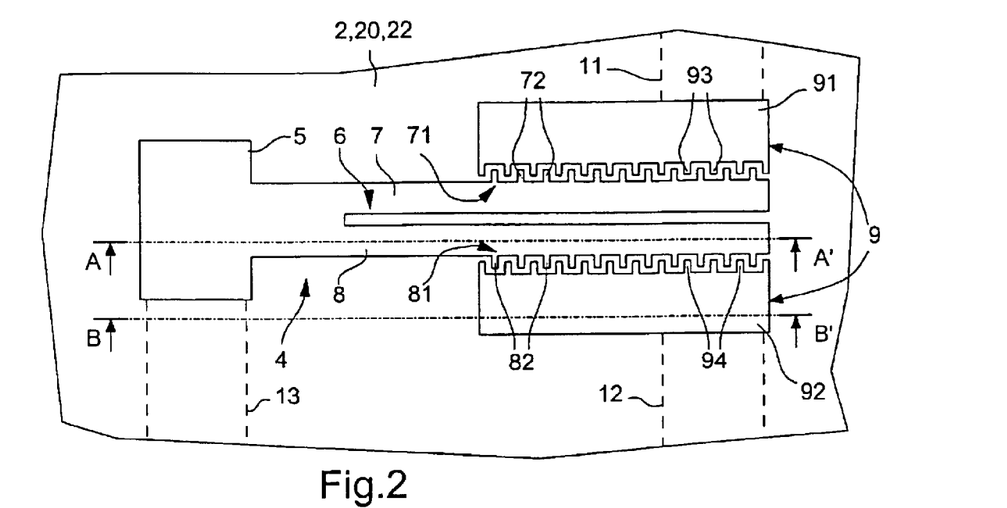
FIG. 2 is a top view of a first embodiment of the time base of FIG. 1 comprising a micromechanical tuning fork resonator realised by means of silicon surface micromachining techniques.

The resonator structure may be obtained by a large variety of different technological processes. Silicon surface micromachining as well as combinations of surface with bulk micromachining can be used. FIGS. 2, 3 and 4 show three non-limiting examples of resonating structures obtained according to three different micromachining techniques. Other techniques known by those skilled in the art to be equally suitable for realising the tuning fork resonator of the present invention may be used. FIGS. 2a, 3a, 4a and 2b, 3b, 4b are cross-sectional views of the resonators of FIGS. 2, 3 and 4 which are taken along lines A-A' and B-B', respectively.

FIG. 2 schematically shows a tuning fork resonator 4 fabricated by means of a surface-micromachining technique on top of a suitable substrate 2, this substrate being preferably a silicon wafer. According to this first technique, a poly-silicon layer is deposited on top of a so-called sacrificial layer, such as e.g. a silicon oxide. After structuring of this poly-silicon layer, the sacrificial layer is partially removed to release the fork tines and form the structure of the resonator.

Figure 2A:
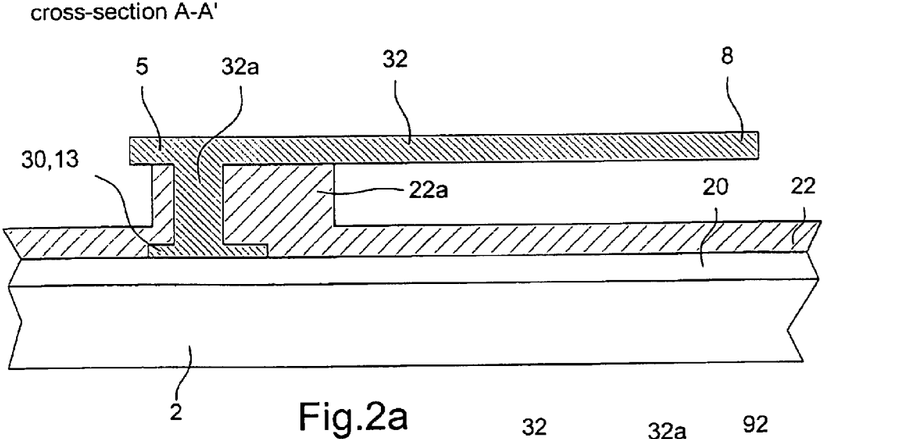
FIGS. 2a and 2b are two cross-sectional views of the embodiment of FIG. 2 taken along lines A–A' and B–B' respectively.
Figure 2B:
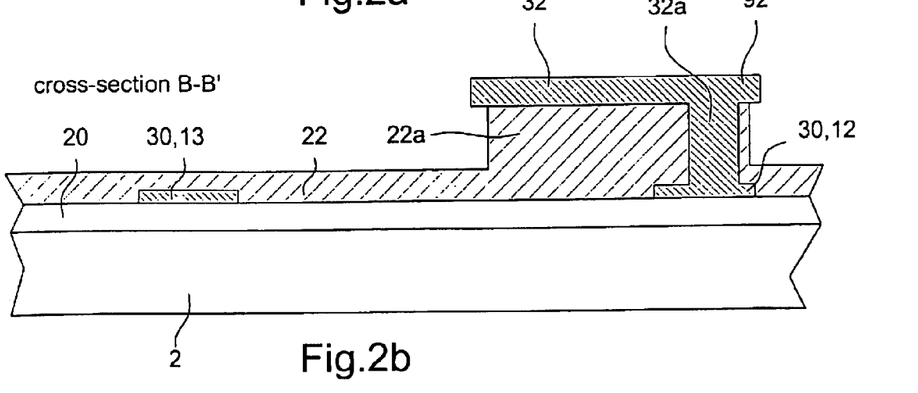
Figure 3:
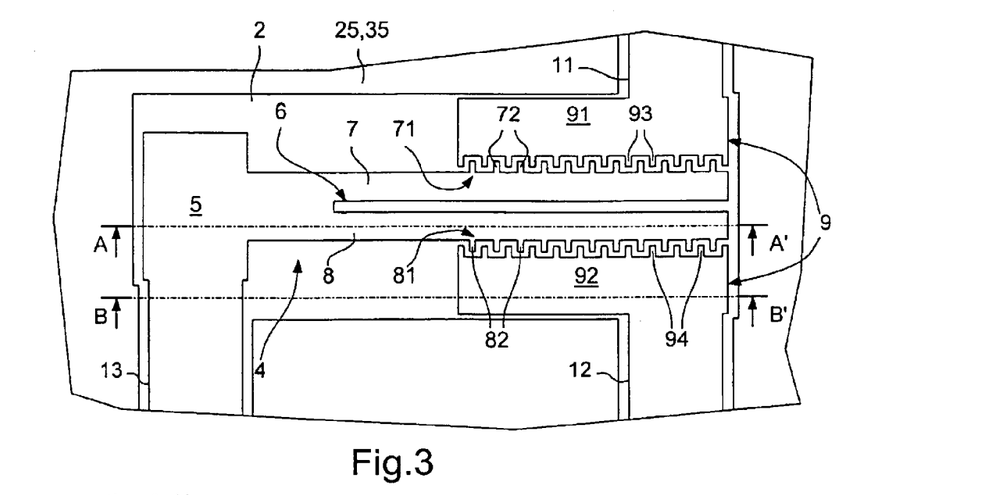
FIG. 3 is a top view of a second embodiment of the time base of FIG. 1 comprising a micromechanical tuning fork resonator which is fabricated using a substrate with a buried oxide layer, such as a silicon-on-insulator (SOI) substrate.

Referring more specifically to the example illustrated in FIGS. 2, 2a and 2b, a first insulating oxide layer 20 is for instance deposited on the semiconductor substrate 2. A first layer of conductive material 30, such as poly-silicon, may be deposited on top of first oxide layer 20. After structuring, this layer 30 forms the conductors 11, 12 and 13 to the first electrode structure 91, the second electrode structure 92 and the base member 5, respectively, as shown in the Figures. Alternatively, conductors 11, 12 and 13 can be doped or metallized zones in or on the substrate. Another oxide layer 22 is then deposited on top of the first oxide layer 20 and structured layer 30. This second oxide layer 22 is selectively etched so as to provide openings in the second oxide layer 22 allowing an electrical contact to the underlying layer of conductive material 30. Then, a second layer of conductive material 32, such as poly-silicon, is deposited on top of the second (sacrificial) oxide layer 22 as well as in the connection openings etched in the oxide layer 22.

Finally, the second layer of conductive material 32 is patterned and etched to form the structure of the resonator 4, i.e. the base member 5 and the fork tines 7, 8, as well as the electrode structures 91 and 92. After structuring of the layer 32, the sacrificial layer 22 is partially removed to release the fork tines 7, 8. It will be appreciated that the layer 22 will also be at least partially removed under the base member 5 and the electrode structures 91, 91 as illustrated in FIGS. 2a and 2b. However, the base member 5 and electrode structures 91, 92 will still be supported by the unetched portions 22a of oxide layer 22 and conductive material 32a connecting the resonator 4 and the electrode structures 91, 92 to the underlying conductors 11, 12, 13.

FIG. 3 schematically shows a tuning fork resonator 4 fabricated by means of a slightly different technique which makes us of a buried oxide layer in, for example, a so-called silicon-on-insulator (SOI) substrate. After structuring of the top silicon layer, the oxide layer is partially removed in order to release the fork tines.

Figure 3A:
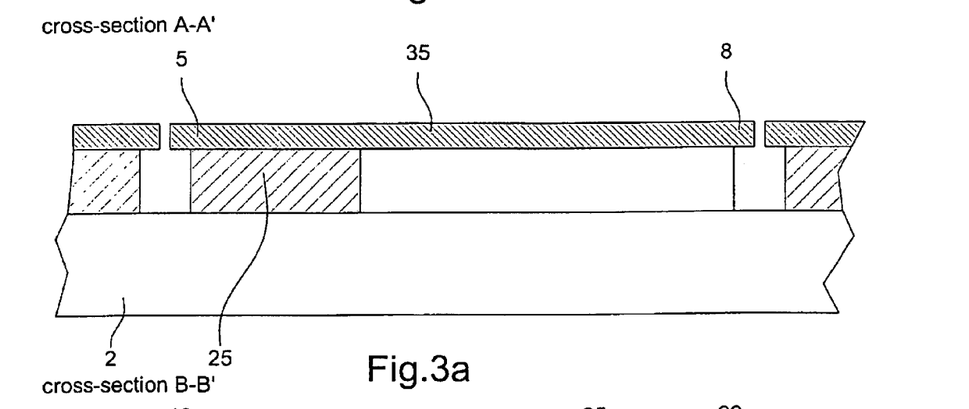
FIGS. 3a and 3b are two cross-sectional views of the embodiment of FIG. 3 taken along lines A–A' and B–B' respectively.
Figure 3B:
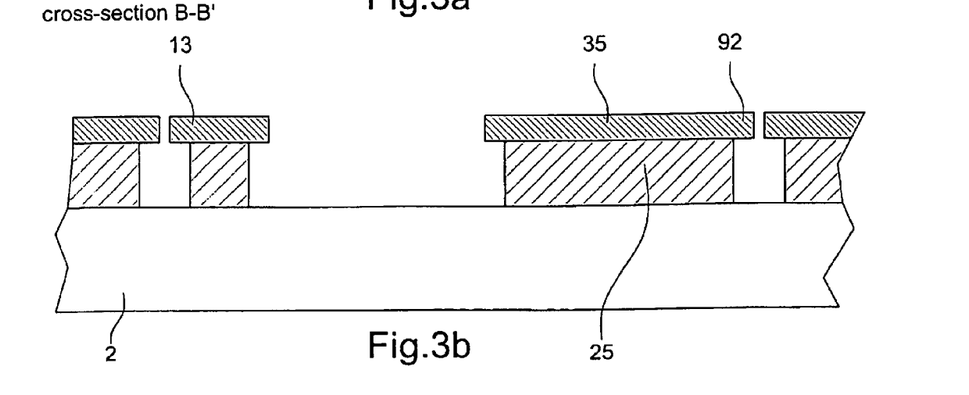
Figure 4:
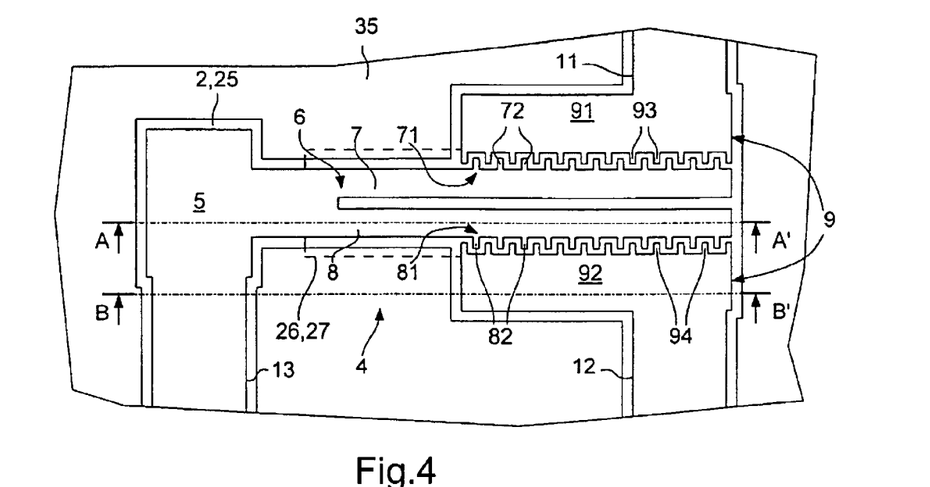
FIG. 4 is a top view of a third embodiment of the time base of FIG. 1 comprising a micromechanical tuning fork resonator which is fabricated using a substrate with a buried oxide layer and by etching the backside of the substrate in order to release the fork tines.

Referring more particularly to FIGS. 3, 3a and 3b, the top silicon layer, indicated by reference numeral 35, is structured so as to form the resonator 4 and the electrode structures 91 and 92. Optionally, the conductors 11, 12 and 13 may also be formed in layer 35. After structuring of the top silicon layer 35, the underlying insulating layer 25 which has been exposed following etching of the silicon layer 35 is etched so as to release the fork tines 7, 8. As schematically illustrated in the Figures, the base member 5 and electrode structures 91, 92 (as well as the conductors 11, 12, 13) have to be designed so as to exhibit a larger surface area than the fork tines 7, 8 so that portions of the insulating layer 25 will remain after the etching process and still support the overlying silicon layer 35, as shown in the cross-sectional views of FIGS. 3a and 3b.

FIG. 4 schematically shows a tuning fork resonator 4 fabricated by means of a third technique which also makes use of a buried oxide layer in, for example, a SOI substrate. Here, after structuring of the top silicon layer, the backside of the substrate is etched so as to open a window which allows to release the fork tines.

Figure 4A:
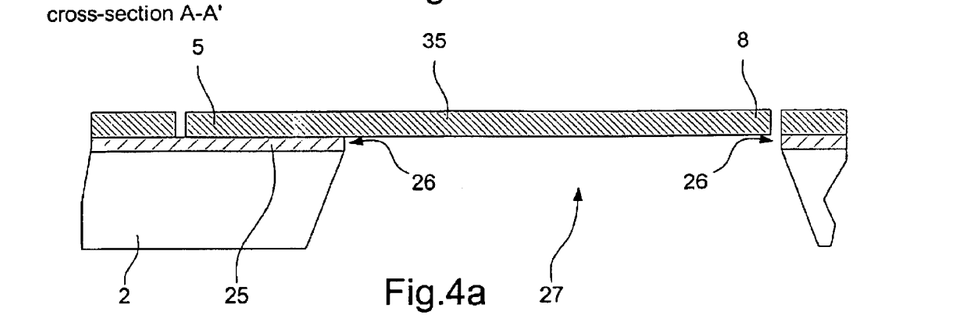
FIGS. 4a and 4b are two cross-sectional views of the embodiment of FIG. 4 taken along lines A–A' and B–B' respectively.
Figure 4B:
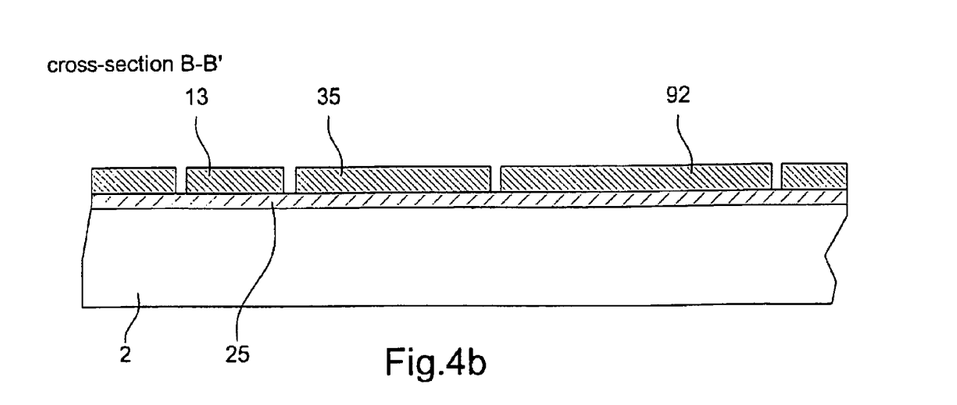

Referring more particularly to FIGS. 4, 4a and 4b, the top silicon layer 35 is structured so as to form the resonator 4 and the electrode structures 91, 92. This step is similar to that realised according to the second technique illustrated in FIG. 3. Thereafter, however, a window 27 is etched on the backside of the substrate 2 using a chemical etchant such as KOH or TMAH for instance. An opening 26 is then etched in the insulating layer 25 thereby releasing the fork tines 7 and 8. This has the advantage that the fork tines can not stick to the substrate (which allows the fabrication of longer tines for lower frequencies), but has the disadvantage to require sealing of the resonator's cavity on both sides (top and bottom) of the substrate in order to operate the resonator under vacuum conditions.

Vacuum sealing of the resonating structure on the chip level can be done by means of batch processing techniques such as anodic bonding or silicon-silicon bonding which are well known to those skilled in the art.

In all of the above-described fabrication techniques, it will be appreciated that additional steps may be provided to form other conductive or non-conductive layers. In addition, with respect to the resonating structures of FIGS. 3 and 4, it will be appreciated that conductors 11, 12, 13 in the silicon layer 35 may be replaced by additional conductive layers connected to the respective parts of the structure or by wires bonded directly on these parts.

Figure 6A:
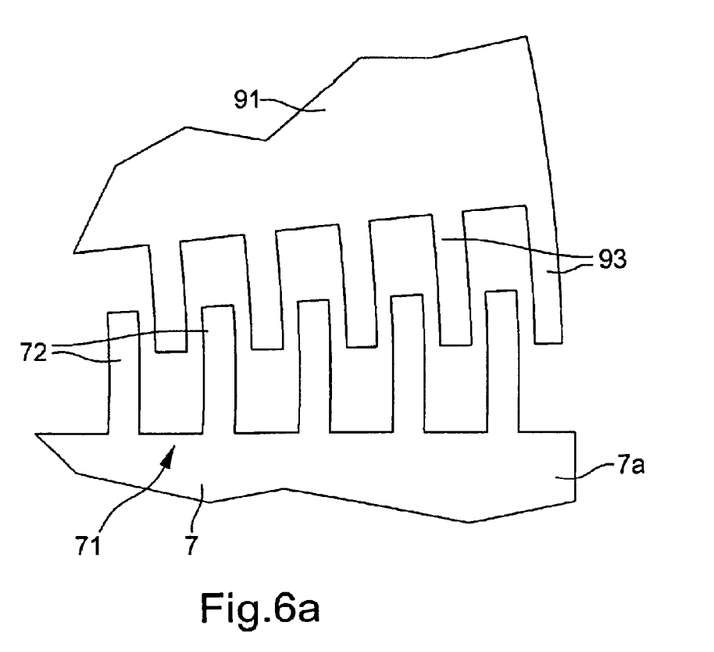
FIGS. 6a and 6b are two partial top views illustrating examples of designs of comb-shaped electrode structures.

As already mentioned, the resonator's tines are preferably provided with comb-shaped structures which mesh with comb-shaped structures of the electrodes. FIG. 6a shows a detailed partial view of the free end 7a of the fork tine 7 of a resonator according to a first variant of design. Here the first and second electrode members 72, 93 of the first fork tine 7 and the electrode structure 91, respectively (as well as the electrode members 82, 94 which are not illustrated in FIG. 6a), have a shape of an arc of circle. Their radius is chosen to follow the movement of a fixed point on the bending line of the fork tine during an entire period of oscillation and is therefore a function of their position on the fork tine 7 (respectively 8) or on the electrode structure 91 (respectively 92).

Figure 6B:
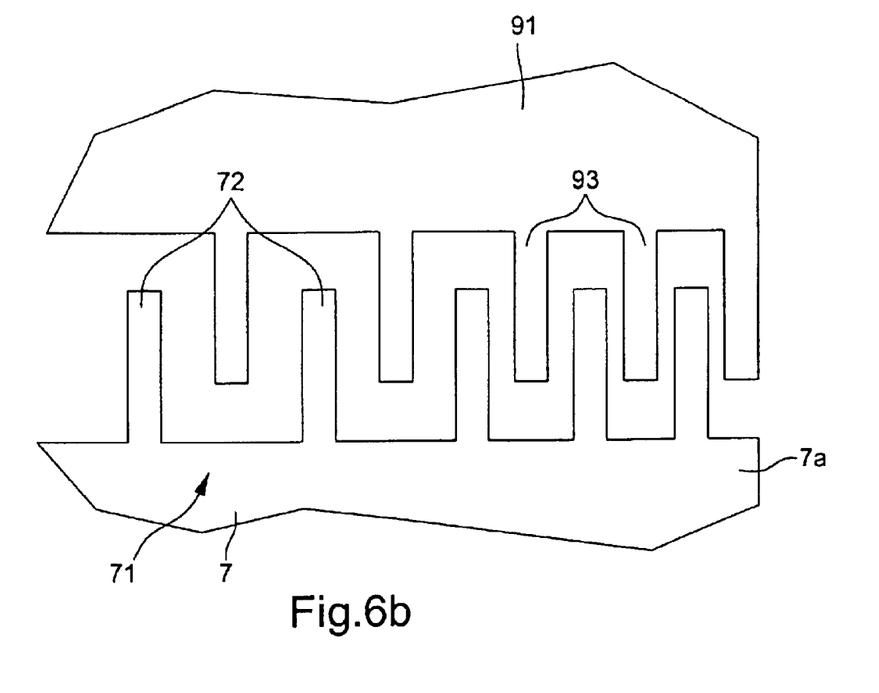

FIG. 6b shows a detailed partial view of another variant of design of the comb-shaped structures where the distance between adjacent electrode members is varied along the length of the fork tine. More particularly, the distance between adjacent electrode members is shortened at the free end of the fork tines. A smaller distance between adjacent electrode members leads to a local increase of the capacitive coupling and therefore a greater electrostatic force on the corresponding part of the tine. By designing the comb-shaped structure in such a way, one can favour the preferred fundamental symmetric in-plane oscillation mode illustrated in FIG. 5b and avoid oscillation of the tuning fork at the first harmonic. In another variant (not shown), the length of the electrode members can be varied along the length of the fork tine in order to excite the desired oscillation mode. As already mentioned, according to a first variant of operation, the comb-shaped electrode structure 91 shown in the embodiment of FIG. 1 serves to electrostatically drive the tuning fork resonator into oscillation and the opposite comb-shaped electrode structure 92 serves to capacitively sense this mechanical oscillation. An alternating voltage signal is applied to electrode structure 91 resulting in electrostatic forces on the first fork tine 7 and oscillation thereof, which oscillation is transmitted to the other tine 8. This oscillation of the second fork tine 8 in turn induces an alternating signal on the opposite set of electrode structure 92, when the resonator operates. It will be understood that electrode structures 91 and 92 are perfectly interchangeable.

Figure 7:
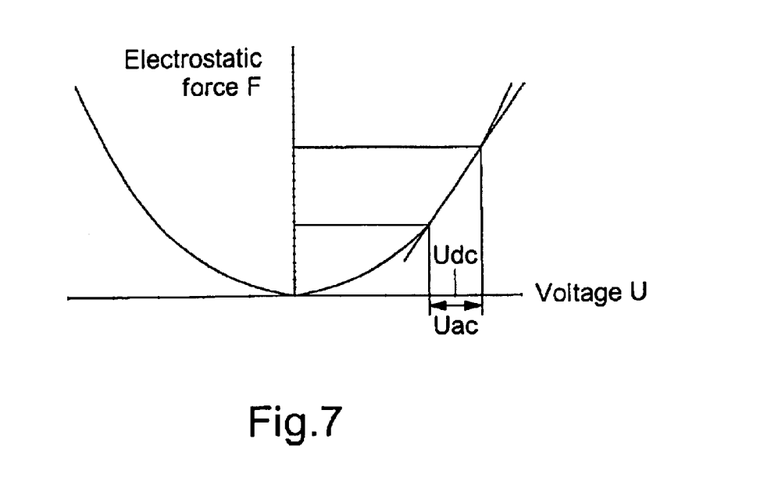
FIG. 7 is a diagram illustrating the relationship between the voltage applied on the electrodes and the resulting electrostatic force on the fork tines.

According to the electrostatic driving principle used to drive the resonator into oscillation, there exists a parabolic relationship between the voltage applied on the electrodes and the resulting force on the tuning fork tines. It is thus desirable to add a constant direct voltage to the alternating voltage so as to obtain a substantially linear force-voltage relationship. FIG. 7 schematically shows this parabolic relationship and the linearisation of the force-voltage relationship by the addition of a constant direct voltage Udc to the alternating voltage Uac where the amplitude of Uac is much smaller than Udc.

In the schematic representation of FIG. 1, there are shown three signal lines or conductors 11 to 13 that are respectively connected to the first electrode structure 91, the second electrode structure 92 and the base member 5 of the tuning fork.

According to a first variant, conductor 13 may be used to apply the direct voltage component to the tuning fork resonator via the base member 5, while the alternating voltage component is applied to the first electrode structure 91 via conductor 11, conductor 12 being used to sense the resulting signal induced on the second electrode structure 92. According to a second variant, the alternating driving voltage and the direct voltage component may be superposed on the first electrode structures 91 via conductor 11 while the tuning fork resonator is tied to a fixed potential, such as e.g. ground, via conductor 13. Conductor 12 is used to sense the signal in this case. It will again be appreciated that electrode structures 91 and 92 are interchangeable and that the second electrode structure 92 may alternatively be used for driving the resonator into oscillation, the first electrode structure 91 being used for sensing.

Alternatively, the electrode structure 9 may be used only for driving, and sensing may be done by detecting a change in impedance at resonance. For instance, the electrode structures 91 and 92 may be connected together or, even, only one electrode structure may be used to drive the resonator into oscillation. According to a first variant, the alternating driving voltage is applied to the set of electrode structures, and the direct voltage component is applied to the tuning fork. According to another variant, the sum of alternating and direct driving voltages can be applied to the set of electrode structures, the tuning fork being in this case tied to a fixed potential such as e.g. ground.

It will be apparent to those skilled in the art that many other electrode arrangements may be used to drive the resonator into oscillation and eventually sense the resulting movement. The arrangement shown in FIG. 1 shall therefore not be considered to be a limitation of the present invention. For instance, the gap between the fork tines may be increased so as to accommodate an electrode structure therebetween which may be used either as a driving electrode structure or as a sensing electrode structure.

Figure 8A:
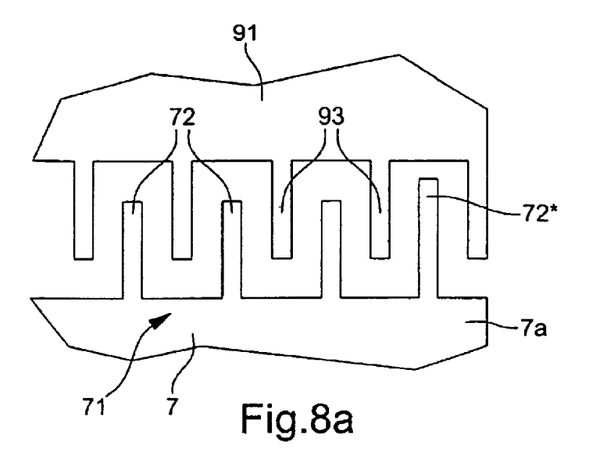
FIGS. 8a to 8c show partial top views of three different designs intended to prevent the tuning fork tines from sticking on the electrode structures.
Figure 8B:
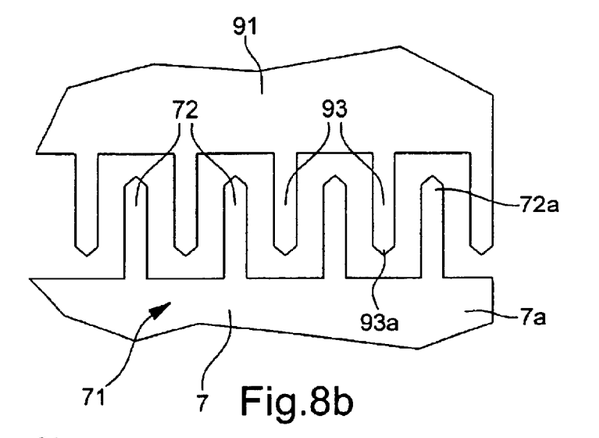
Figure 8C:
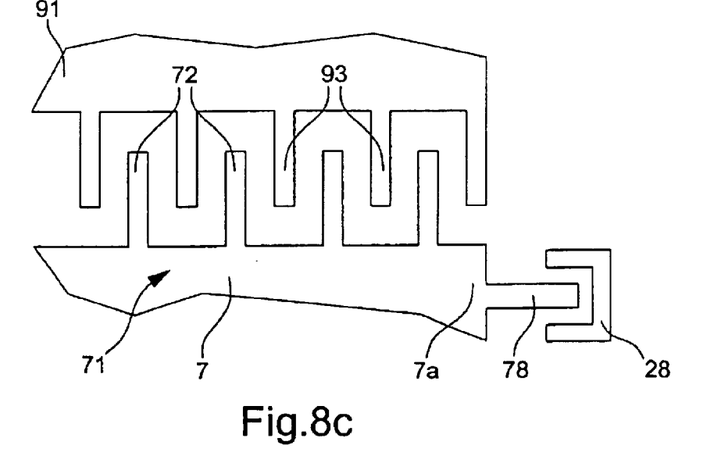

FIGS. 8a to 8c show three different advantageous design features intended to prevent the fork tines of the resonator from sticking on the electrodes in case of a shock. According to a first variant shown in FIG. 8a, at least one 72* of the electrode members 72 (the same applies to the electrode members 82) can be made longer than the others, thereby reducing the adhesion forces when the comb-shaped structure 71 and the comb-shaped electrode structure 91 (or 81 and 93) get into mechanical contact with each other. Obviously, the same effect may be obtained when one of the electrode members 93 (or 94 with respect to the second fork tine) is longer than the others.

Alternatively, as shown in FIG. 8b, extremities 72a of the electrode members 72, and/or extremities 93a of the electrode members 93, may be designed so as to exhibit a pointed shape or at least a suitably small surface area so as to prevent sticking of the fork tines. Obviously, the same applies to the second fork tine 8 and the second electrode structure 92.

Finally, as shown in the variant of FIG. 8c, a stop structure 28 disposed on the substrate 2 may be provided at the free end 7a of the fork tine 7, this free end 7a being provided with an extension 78 cooperating with the stop structure 28. This stop structure 28 is designed so as to limit the angular movement of the fork tine 7 and therefore prevent it from sticking on the electrode structure 91 when excessive angular movements take place due, for instance, to mechanical shocks. Again, the same obviously applies to the second fork tine 8.

All of the above-mentioned features can be combined in a suitable manner in order to obtain an efficient anti-sticking mechanism.

Figure 9:
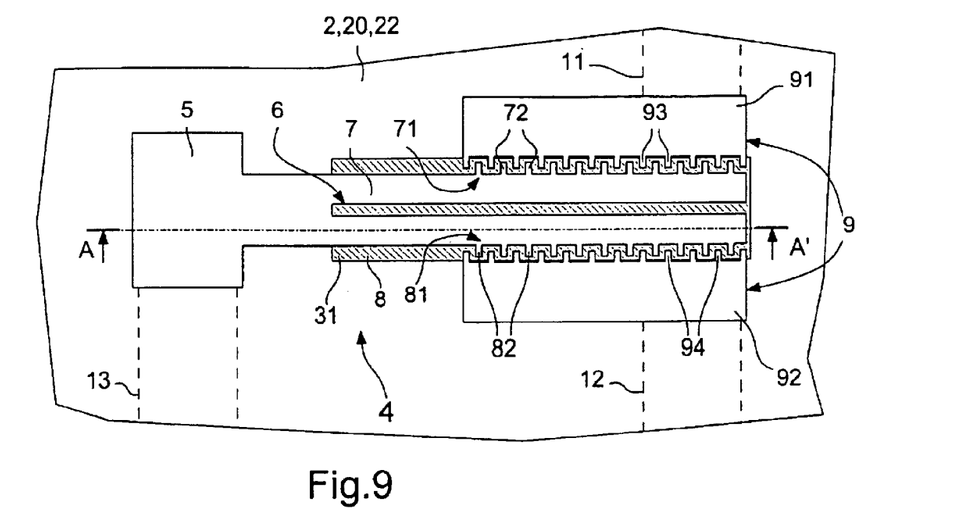
FIG. 9 shows a top view illustrating an improvement of the first embodiment shown in FIG. 2.
Figure 9A:
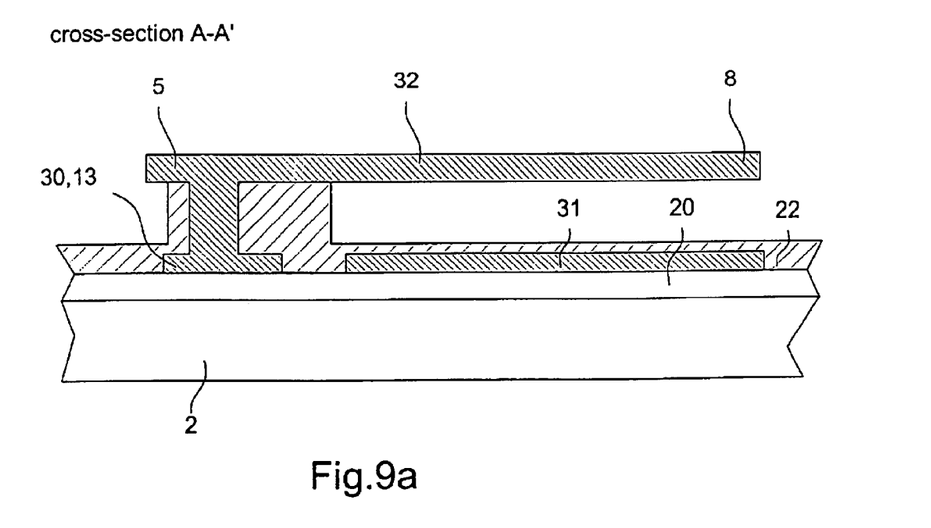
FIG. 9a is a cross-sectional view of the embodiment of FIG. 9 taken along line A–A'.

FIGS. 9 and 9a show an improvement of the micromechanical tuning fork resonator 4 which is illustrated in FIGS. 2, 2a and 2b. FIG. 9a shows a cross-sectional view of FIG. 9 taken along line A–A'. A conductive pattern 31 is provided on (or below) the surface of the substrate 2 (in this case on top of the first oxide layer 20) under at least part of the free-standing oscillating structure 6, i.e. fork tines 7 and 8, the shape of this conductive pattern 31 being essentially a projection of the free-standing oscillating structure 6 on the surface of the substrate 2. This conductive pattern 31 may be formed simultaneously with the conductors 11, 12, 13 out of the first layer of conductive material 30. Furthermore, the conductive pattern 31 may be in direct electrical contact with conductor 13 which is connected to the base member 5 thereby putting conductive pattern 31 and the free-standing oscillating structure 6 to the same potential. Alternatively, conductive pattern 31 may be formed in an additional step out of e.g. a metal.

Connecting the conductive pattern 31 to the same potential as the free-standing oscillating structure 6 suppresses forces perpendicular to the substrate 2 between the tuning fork resonator 4 and the surface of the substrate 2 leading to a resonant frequency which is independent of the applied voltages. Such a conductive pattern 31 furthermore prevents the tines 7, 8 from sticking on the substrate. It will easily be understood that a similar conductive pattern may also be added to the resonators fabricated using other techniques, such as the resonator illustrated in FIGS. 3, 3a and 3b or FIGS. 4, 4a and 4b.

The resonant frequency of the tuning fork resonator can be adjusted over a wide range by changing the geometrical dimensions of the device, namely the length and width of the fork tines, as this can be seen from the following so-called "Karolus" expression of the resonant frequency of a tuning fork with tines of length l, width w and made of material with Young's modulus E and density ρ:

$$f_r = c \cdot \frac{w}{l^2} \cdot \sqrt{\frac{E}{\rho}}$$

where c is a constant depending on the exact shape and mode of operation of the tuning fork.

It is important for mass production of such tuning fork resonators to keep the resonant frequency from one chip to the other within small tolerances. The resonant frequency of the tuning fork resonators does not depend on the thickness of the tuning fork, as is easily seen from the above expression. Therefore, the resonant frequency of e.g. tuning forks fabricated using poly-silicon surface-micromachining technology will not depend on the thickness of the deposited poly-silicon layer resulting in a strongly enhanced process robustness.

Figure 10:
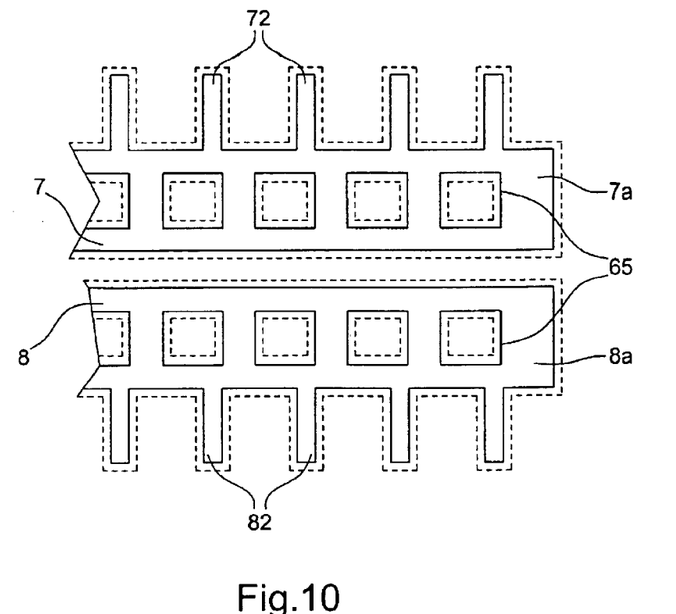
FIG. 10 shows part of the fork tines of the resonator with openings therein.

Tolerances in the resonant frequency due to slight variations in process parameters can be greatly reduced by carefully dimensioning the tuning fork. In particular, as schematically illustrated in FIG. 10, openings 65 may be provided in the fork fines 7, 8 so as to reduce the dependency of the resonant frequency on process parameters. Indeed, the resonant frequency of the tuning fork will be lower than the projected frequency if the width of the tines 7, 8 is smaller after processing, e.g. due to an over-etch, than a desired width. At the same time, however, the openings 65 provided in the fork tines 7, 8 will be larger thereby reducing the mass of the fork tines 7, 8 and compensating the decrease of the resonant frequency (it should be pointed out that the above expression of the resonant frequency does not apply to a tuning fork provided with openings such as illustrated in FIG. 10). Electrode members 72, 82 of the comb-shaped structures 71, 81 have the same effect as the openings 65 on the resonant frequency of the tuning fork when overetching occurs.

Preferably, the openings 65 are to be provided close to the free end 7a, 8a of the tines 7, 8 so as to have a higher impact on the resonant frequency without affecting the quality factor of the tuning fork resonator.

The surface area required by the micromechanical tuning fork resonator according to the present invention is very small with respect to the resonant frequency obtained. For instance, a tuning fork resonator according to the present invention designed for a rather low frequency of 32 kHz requires a surface of approximately 0.2 mm$^2$. Conventional structures require a relatively large surface area in order to obtain such a low frequency. For a given geometrical layout, the dimensions and frequency are inversely related, i.e. the larger the geometrical dimensions, the lower the frequency.

The resonant frequency of the tuning fork resonator is, within the temperature range of 0 to 60° C., in good approximation, a linear function of temperature. At a resonant frequency of 65 kHz, it has been observed that the thermal coefficient of the resonant frequency is of the order of −30 ppm/° C. It is thus desirable to incorporate, in the same substrate, a temperature measuring circuit having an output signal which may be used to compensate for the frequency variation by adequately adjusting the frequency of the signal produced by the time base.

To this effect, the time base according to the present invention may advantageously comprise an integrated temperature measuring circuit (not shown). An example of such a temperature measuring circuit is described in the article "Smart Temperature Sensor in CMOS Technology" by P. Krumenacher and H. Oguey, in "Sensors and Actuators", A21–A23 (1990), pages 636 to 638. Here, temperature compensation is achieved by acting on the division ratio of the division chain, for instance using an inhibition technique well known to those skilled in the art.

Figure 11:
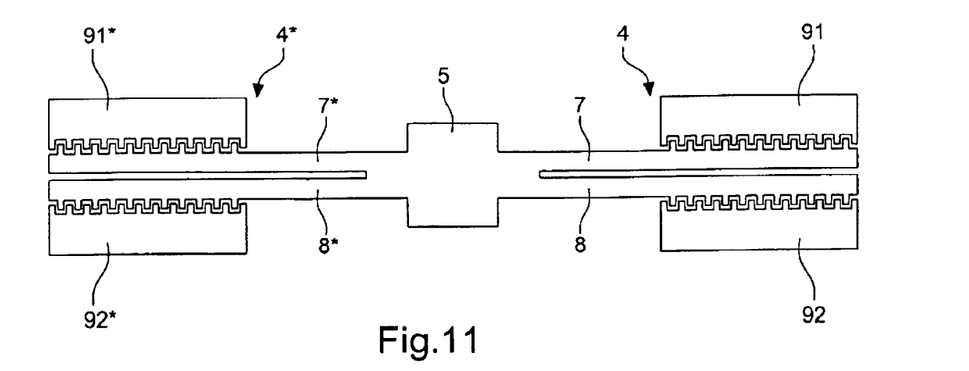
FIG. 11 shows two tuning fork resonators sharing the same base member and designed to exhibit two different resonant frequencies.

Alternatively, two tuning fork resonators with different resonant frequencies may be integrated onto the same chip, such arrangement allowing the chip temperature to be precisely determined by measuring the frequency difference of the two resonators (both tuning fork resonators have the same temperature coefficient since they are made from the same material). Advantageously, as shown in FIG. 11, two tuning fork resonators 4 and 4* having different resonant frequencies can share the same base member 5 in order to reduce the required surface area on the chip.

The advantage of using integrated time bases according to the present invention is twofold: Firstly, the temperature dependency of the tuning fork resonator is linear which facilitates the electronic signal treatment necessary to compensate for the temperature. Secondly and more importantly, the small size and monolithic integration of the tuning fork resonator allows a second resonator to be provided with only a slight increase in chip size and without further external connections.

Alternatively, according to a particularly advantageous embodiment of the invention, it is possible to use a single tuning fork resonator which operates simultaneously with two oscillation modes. A first of these modes is the above described in-plane oscillation mode (FIG. 5b). A second oscillation mode may be a vertical oscillation mode, wherein the fork tines 7, 8 perform a substantially vertical oscillation perpendicular to the substrate plane. This vertical oscillation mode may be excited electrostatically and sensed capacitively by using further electrodes on the substrate under the tuning fork resonator. The two modes are selected to have different frequencies so that temperature compensation may be achieved by measuring the frequency difference which is directly related to temperature. Different resonant frequencies for the vertical and in-plane oscillation modes can be obtained by choosing a rectangular cross-section of the fork tines.

Preferably, the vertical oscillation mode should consist in an asymmetric vertical oscillation of the fork tines where the tines oscillate in opposite directions. Indeed, the forces exerced by both fork tines on the base 5 during oscillation compensate each other in the case of asymmetric vertical oscillation whereas they add up in the case where the fork tines oscillate vertically in the same direction resulting in an enhanced power dissipation and therefore a reduced quality factor. The vertical oscillation mode may however also consist in a symmetric vertical oscillation of the fork tines.

Figure 12:
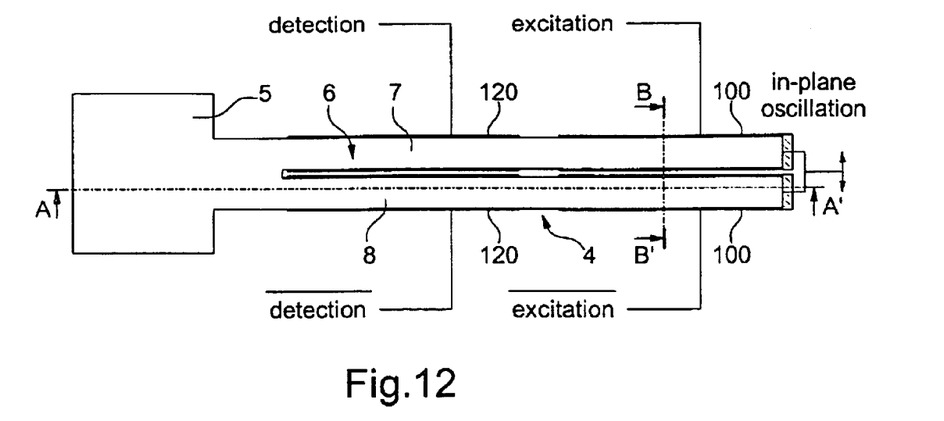
FIG. 12 is a top view illustrating a second mode of oscillation where the fork tines perform a vertical oscillation in opposite directions perpendicularly to the substrate plane.
Figure 12A:
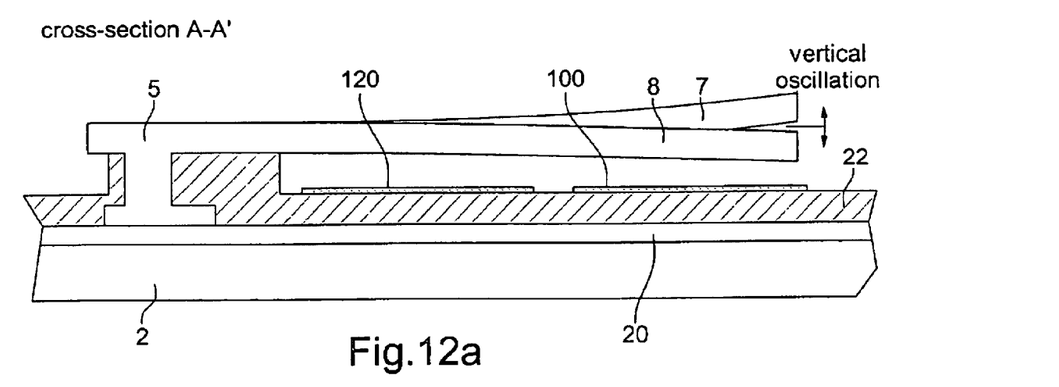
FIGS. 12a and 12b are two cross-sectional views of the illustration of FIG. 12 taken along lines A–A' and B–B' respectively.
Figure 12B:
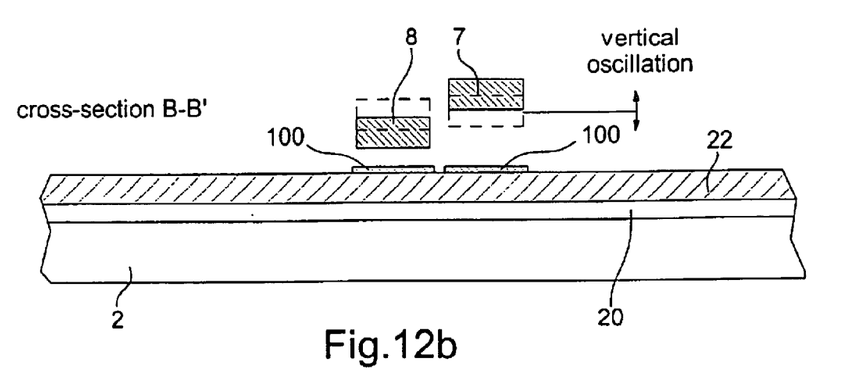

FIGS. 12, 12a and 12b are schematic illustrations of an electrode arrangement allowing vertical oscillation of the fork tines in opposite directions. As shown in these figures, two sets of electrodes 100 and 120 are disposed on the surface or in the surface region under the fork tines 7, 8. The first set of electrodes 100 drives the fork tines 7, 8 into a vertical oscillation and the second set of electrodes 120 senses this vertical oscillation. The set of driving electrodes 100 is disposed under the free end part of the fork tines 7, 8 whereas the set of sensing electrodes 120 is disposed under the fork tines 7, 8 between the base member 5 and the set of driving electrodes 100. It will however be understood that the electrodes 100 and 120 are perfectly interchangeable.

More particularly, in order to drive the fork tines into oscillation so that the fork tines oscillate in opposite directions as illustrated in the Figures, it is preferable to divide the set of driving electrodes 100 into two electrodes disposed under each of the fork tines 7, 8 as shown, the two electrodes being supplied with signals having opposite phases. Obviously, the set of sensing electrodes 120 is similarly to be divided into two electrodes providing signals with opposite phases.

Having described the invention with regard to certain specific embodiments, it is to be understood that these embodiments are not meant as limitations of the invention. Indeed, various modifications and/or adaptations may become apparent to those skilled in the art without departing from the scope of the annexed claims.

What is claimed is:

1. Time base comprising a resonator (4) and an integrated electronic circuit (3) for driving said resonator (4) into oscillation and for producing, in response to said oscillation, a signal having a determined frequency, characterised in that said resonator is an integrated micromechanical tuning fork resonator (4) supported above a substrate (2) and adapted to oscillate, according to a first oscillation mode, in a plane substantially parallel to said substrate (2), said tuning fork resonator (4) comprising:

a base member (5) extending substantially perpendicularly from said substrate (2);

a free-standing oscillating structure (6) connected to said base member (5) and including at least a first pair of substantially parallel fork tines (7, 8) disposed in said plane; and an electrode structure (9) disposed adjacent to said fork tines (7, 8) and connected to said integrated electronic circuit (3), said time base being further characterised in that each of said fork tines (7, 8) is provided with a comb-shaped structure (71, 81) disposed in said plane and including first electrode members (72, 82) extending substantially perpendicularly from a first side of said fork tines (7, 8), and in that said electrode structure (9) comprises at least one comb-shaped electrode structure (91, 92)

meshing with said comb-shaped structure (71, 81) of a fork tine (7, 8) and comprising second electrode members (93, 94) adjacent to said first electrode members (72, 82).

2. Time base according to claim 1, characterised in that said electronic circuit (3) is integrated on said substrate (2) together with said micromechanical tuning fork resonator (4).

3. Time base according to claim 1, characterised in that said electrode members (72, 82, 93, 94) have a shape of an arc of circle.

4. Time base according to claim 1, characterised in that a distance between adjacent electrode members (72, 82, 93, 94) is varied along the length of the fork tines (7, 8) so that the distance between adjacent electrode members (72, 82, 93, 94) is shorter at a free end (7a, 8a) of said fork tines (7, 8).

5. Time base according to claim 1, characterised in that a stop structure (28) is provided on said substrate (2) adjacent to a free end (7a, 8a) of each of said fork tines (7, 8) in order to limit movements of said fork tines (7, 8) and prevent them from sticking on said electrode structure (9) in case of a shock.

6. Time base according to claim 1, characterised in that extremities (72a, 93a) of said electrode members (72, 82, 93, 94) are pointed or have a suitably small surface area so as to prevent said fork tines (7, 8) from sticking on said electrode structure (9) in case of a shock.

7. Time base according to claim 1, characterised in that at least one (72*) of said electrode members (72, 82, 93, 94) is longer than the others so as to prevent said fork tines (7, 8) from sticking on said electrode structure (9) in case of a shock.

8. Time base according to claim 1, characterised in that said electrode structure comprises:

a first electrode structure (91) adjacent to a first (7) of said fork tines (7, 8) for driving said tuning-fork resonator (4) into oscillation; and a second electrode structure (92) adjacent to the other (8) of said fork tines (7, 8) for sensing a signal resulting from the oscillation of said tuning fork resonator (4), and in that said free-standing oscillation structure (6) is tied via said base member (5) to a fixed potential, a constant direct voltage component (Udc) being added to one or both of said first electrode Structure (91) or free-standing oscillating structure (6).

9. Time base according to claim 1, characterised in that said electrode structure (9) comprises at least one electrode structure disposed adjacent to one or both of said fork tines (7, 8) for driving said tuning-fork resonator (4) into oscillation, and in that said free-standing oscillation structure (6) is tied via said base member (5) to a fixed potential, a constant direct voltage component (Udc) being added to one or both of said at least one electrode structure (91, 92) or free-standing oscillating structure (6), and sensing being done by detecting a change in impedance at resonance.

10. Time base according to claim 1, characterised in that said first oscillation mode is a symmetric oscillation mode where both fork tines (7, 8) oscillate in opposite directions.

11. Time base according to claim 1, characterised in that a conductive pattern (31) having substantially the shape of said free-standing oscillating structure (6) is provided on a surface of said substrate (2) under at least a part of said free-standing oscillating structure (6), said free-standing oscillating structure (6) and said conductive pattern being put at a same potential.

12. Time base according to claim 1, characterised in that openings (65) are provided in said fork tines (7, 8) so as to substantially compensate for the effect of an under- or over-etch on the resonant frequency of said tuning fork resonator (4).

13. Time base according to claim 1, characterised in that it further comprises an integrated temperature measuring circuit intended to compensate for the effect of temperature on the frequency of the signal produced by said time base.

14. Time base according to claim 1, characterised in that it further comprises a second micromechanical tuning fork resonator (4*) supported above said substrate (2) and adapted to oscillate at a resonant frequency which is different from the resonant frequency of the first resonator, the temperature-dependent frequency difference between both resonant frequencies being used for compensating for the effect of temperature on the frequency of the signal produced by said time base.

15. Time base according to claim 14, characterised in that said first and second tuning fork resonators (4, 4*) share the same base member (5).

16. Time base according to claim 1, characterised in that electrodes (100, 120) are disposed under said free-standing oscillating structure (6) in such a way as to drive and sense a second oscillation mode having a resonant frequency which is different from the resonant frequency of said first oscillation mode, the temperature-dependent frequency difference between the resonant frequencies of both oscillation modes being used for compensating for the effect of temperature on the frequency of the signal produced by said time base.

17. Time base according to claim 16, characterised in that said second oscillation mode is a vertical oscillation mode where both fork tines (7, 8) oscillate in opposite directions substantially perpendicularly to said substrate (2).

18. Time base according to claim 1, characterised in that said substrate (2) and said tuning fork resonator (4) are made of silicon material.

* * * * *